United States Patent
Perner et al.

(10) Patent No.: US 9,792,980 B2
(45) Date of Patent: Oct. 17, 2017

(54) THREE DIMENSIONAL RESISTIVE MEMORY ARCHITECTURES

(71) Applicant: Hewlett Packard Enterprise Development LP, Houston, TX (US)

(72) Inventors: Frederick Perner, Palo Alto, CA (US); Kwangmyoung Rho, Icheon (KR); Jeong Hwan Kim, Icheon (KR); Sangmin Hwang, Icheon (KR); Jinwon Park, Icheon (KR); Jae Yun Yi, Icheon (KR); Jae Yeon Lee, Icheon (KR); Sung Won Chung, Icheon (KR)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/031,813

(22) PCT Filed: Oct. 31, 2013

(86) PCT No.: PCT/US2013/067823
§ 371 (c)(1),
(2) Date: Apr. 25, 2016

(87) PCT Pub. No.: WO2015/065443
PCT Pub. Date: May 7, 2015

(65) Prior Publication Data
US 2016/0247565 A1 Aug. 25, 2016

(51) Int. Cl.
*G11C 8/10* (2006.01)
*G11C 13/00* (2006.01)
(Continued)

(52) U.S. Cl.
CPC ............ *G11C 13/0028* (2013.01); *G11C 8/10* (2013.01); *G11C 13/0002* (2013.01);
(Continued)

(58) Field of Classification Search
CPC ............ G11C 13/0028; G11C 13/0026; G11C 13/0023; G11C 8/10; G11C 2213/77; G11C 2213/71; H01L 27/2481; H01L 27/2436
See application file for complete search history.

(56) References Cited

U.S. PATENT DOCUMENTS

| 5,761,110 A | 6/1998 | Irrinki et al. |
| 2008/0025131 A1 | 1/2008 | Scheuerlein et al. |

(Continued)

FOREIGN PATENT DOCUMENTS

KR 10-2008-0064370 A 7/2008

OTHER PUBLICATIONS

International Searching Authority, The International Search Report and the Written Opinion, Jul. 30, 2014, 9 Pages.
(Continued)

*Primary Examiner* — Douglas King
(74) *Attorney, Agent, or Firm* — Fabian VanCott

(57) ABSTRACT

In one example, a three dimensional resistive memory architecture includes adjacent memory tiles with each tile including a multilevel resistive crossbar array and at least one decoder. The multilevel crossbar array includes layers of row crossbars, layers of column crossbars, and layers of resistive memory elements interposed between cross points of the row crossbars and the column crossbars, in which at least one layer of crossbars extends from a first tile through an adjacent tile and is used to address resistive memory elements in the adjacent tile. The at least one decoder underlies the multilevel resistive crossbar array and includes an address matrix comprising digital lines and analog lines, in which the digital lines select which crossbars are connected to the analog lines.

11 Claims, 12 Drawing Sheets

(51) Int. Cl.
*H01L 45/00* (2006.01)
*H01L 27/24* (2006.01)
(52) U.S. Cl.
CPC ........ *G11C 13/004* (2013.01); *G11C 13/0023* (2013.01); *G11C 13/0026* (2013.01); *G11C 13/0069* (2013.01); *H01L 27/2436* (2013.01); *H01L 27/2481* (2013.01); *H01L 45/04* (2013.01); *G11C 2213/71* (2013.01); *G11C 2213/77* (2013.01)

(56) References Cited

U.S. PATENT DOCUMENTS

| | | |
|---|---|---|
| 2008/0313525 A1 | 12/2008 | Baker |
| 2009/0256133 A1 | 10/2009 | Kau et al. |
| 2010/0315866 A1 | 12/2010 | Park et al. |
| 2011/0199814 A1 | 8/2011 | Meade |
| 2011/0242872 A1* | 10/2011 | Hanzawa ............... G11C 7/18 365/51 |
| 2011/0310653 A1 | 12/2011 | Kreupl et al. |
| 2012/0098566 A1 | 4/2012 | Robinett |
| 2013/0083048 A1 | 4/2013 | Weiss |
| 2013/0210211 A1 | 8/2013 | Vereen et al. |

OTHER PUBLICATIONS

Kavehei, O. et al., An Analytical Approach for Memristive Nanoarchitectures, Dec. 15, 2011, 12 Pages.

* cited by examiner

THREE DIMENSIONAL RESISTIVE MEMORY ARCHITECTURES

BACKGROUND

In the past decades, the semiconductor industry has been improving the performance and density of integrated circuits primarily by shrinking the size of the electronic elements within the circuits. However, a number of barriers are becoming evident which increase the difficulty of making further reduction to the size of these elements. One potential solution for increasing the performance and planar density of integrated circuits is to create three dimensional circuits which contain multiple layers of interconnected circuitry.

BRIEF DESCRIPTION OF THE DRAWINGS

The accompanying drawings illustrate various examples of the principles described herein and are a part of the specification. The illustrated examples are merely examples and do not limit the scope of the claims.

Throughout the drawings, identical reference numbers designate similar, but not necessarily identical, elements.

DETAILED DESCRIPTION

Figure 1:
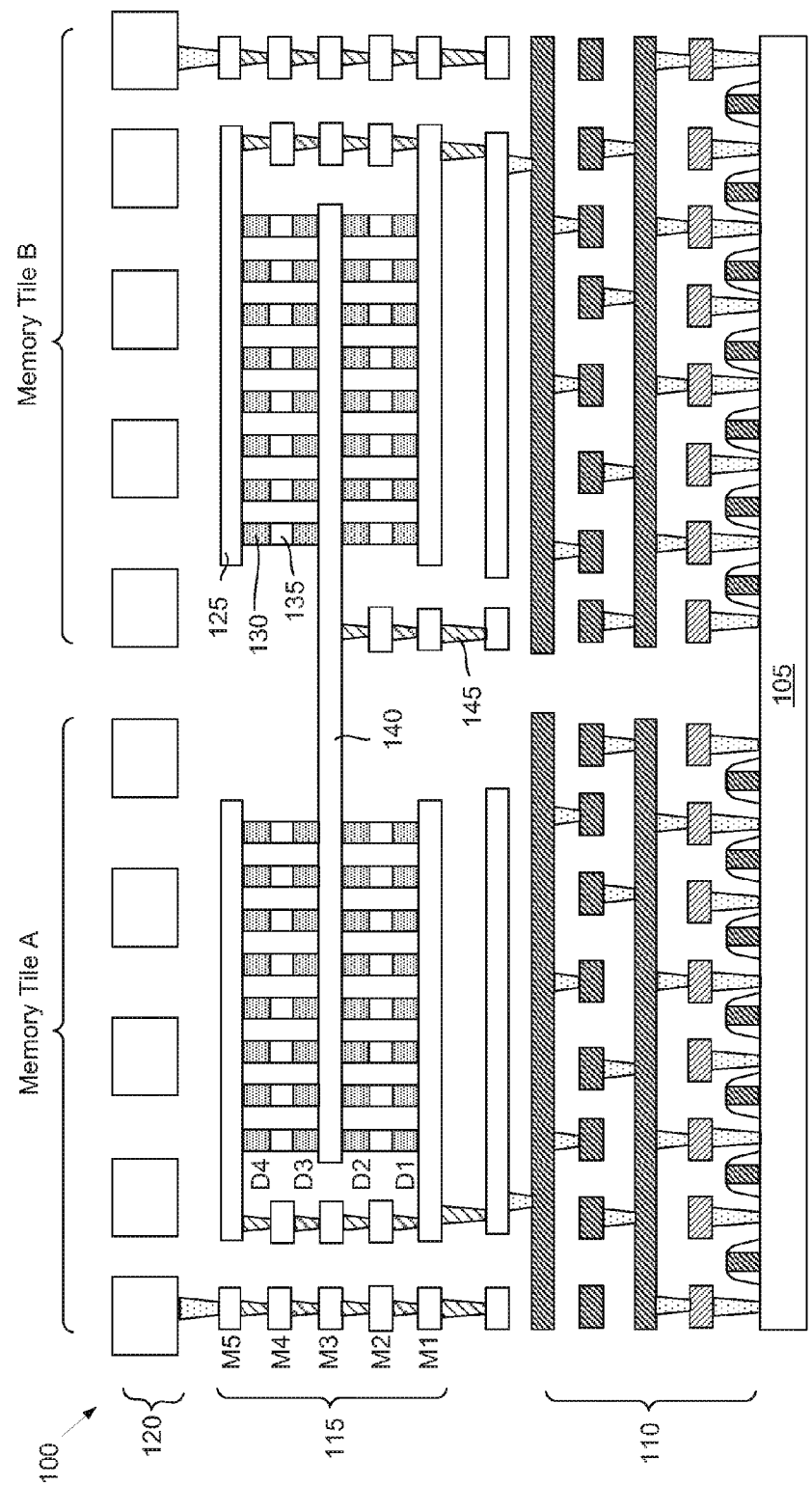
FIG. 1 is a cross sectional diagram of a three dimensional resistive memory architecture that comprises adjacent interconnected tiles, according to one example of principles described herein.

Three dimensional memory architectures use multiple layers of memory to achieve greater memory density in a smaller foot print. For some resistive memory architectures, such as memristor memory arrays, switching transistors in the memory arrays can be eliminated, resulting in memory densities that approach the fundamental size limit of the manufacturing technology. This can result in memory storage devices with a lower total cost, greater capacity, and smaller size.

However, the use of multilayer high density resistive memory arrays results in several challenges. For example, it is desirable to address the resistive memory elements in the arrays without undue negative impacts on the space efficiency of the memory. Additionally, resistive memory elements may have specific control requirements that are not present in other devices. For example, resistive memory elements may be inherently analog devices that are best controlled using bipolar analog signals. This can introduce additional complexity to the addressing scheme because a resistive memory element must not only be selected, but must also have the desired analog signals routed to the selected element.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with the example is included in at least that one example, but not necessarily in other examples. Further, as used in the present specification and in the appended claims, the term "a number of" or similar language is meant to be understood broadly as any positive number comprising 1 to infinity; zero not being a number, but the absence of a number.

The principles described below are directed to a high density three dimensional resistive memory architecture that uses a four dimensional addressing scheme and a versatile block-tile layout. The four dimensional addressing is applied to a set of 'final decoders' to contact the mid-points of short row and column conductors in the three dimensional memory structure. Unique placement of the final decoders under the memory tile allows memory tiles to be assembled in large, high density memory blocks. The four dimensional addressing both selects a target memory element and directs analog signals to read and write data to the resistive memory elements.

One example describes a high density, four plane, cross point memristor memory architecture featuring four dimensional address decoding. Incoming addresses are divided into four parts and applied to a two stage decoder that includes an addressing matrix. The first stage of the decoder translates the four parts of the address into a selection of two final decoders in the addressing matrix. The final decoders connect the desired analog signals to the target row crossbar and column crossbar. The analog signals are applied to the row crossbar and column crossbar to perform the desired read or write operation on the resistive memory element sandwiched between the row crossbar and column crossbar. Thus, the four dimensional addressing provides both the selection of a target memory element and provides the voltages and currents to READ and WRITE the target memory element. The addressing architecture is split into a row decoder and a column decoder to efficiently connect to edge contacts of the three dimensional memory arrays and to allow versatile tiling of multiple memory blocks into larger scale memory elements.

FIG. 1 is a cross sectional diagram of a portion of a three dimensional resistive memory architecture (100) for use in a data storage device. The three dimensional resistive memory architecture (100) includes a number of interconnected segments called "memory tiles" or "tiles." In this example, there are only two memory tiles shown, tile A on left and tile B on the right. Each tile includes a substrate (105), support circuitry (110) formed on the substrate, and a resistive crossbar memory array (115) constructed over the support circuitry. Over the crossbar memory array a number of overlying traces (120) can be formed. These overlying traces may be used to supply power and/or control signals to the various tiles.

The crossbar memory array (115) includes a number of metal layers (M1, M2, M3, M4, M5). These metal layers form traces and crossbars within the memory array. In this example, metal layers M1, M3 and M5 form row crossbars (125) that run from left to right in the diagram. Metal layers M2 and M4 form column crossbars (135) that are directed into the page. In general, each row crossbar crosses over each column crossbar. At each cross point, a memory element (130) is interposed between the row crossbar (125) and the column crossbar (135). In one example, the memory elements may be nonvolatile resistive memory such as memristor devices. The memory element may have a variety of configurations, including configurations that include a volatile switch with a very high ON/OFF ratio and a nonvolatile switch for storing data.

The support circuitry (110) provides addressing that allows specific row and column crossbars to be selected and the appropriate voltages applied to the selected row and column crossbars. To access a memory element, the row crossbar and column crossbar that sandwich the target memory element are selected. The target memory element can then be selectively written with new data or read to retrieve data that was previously written in the target memory device.

In this example, the M3 row crossbars (140) from memory tile B extend into memory tile A. The M3 row crossbars are connected to the underlying support circuitry by vias (145). Because the M3 row crossbars extend from the memory tile B into the memory tile A, M3 row crossbars are connected to memory elements in both memory tile B and memory tile A. Consequently, the addressing circuitry underlying memory tile B that is used to control/select the M3 row crossbars is also used to address some of the memory elements in memory tile A. This provides a number of benefits, including reducing the number of addressing decoders that are needed, thereby resulting in a more compact and potentially less expensive storage device.

Figure 2B:
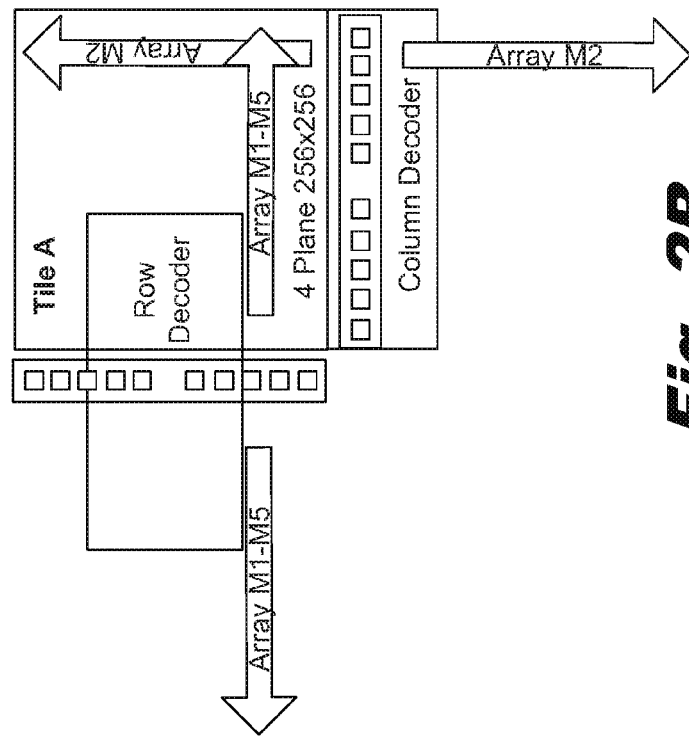
FIGS. 2A and 2B show two different tiles in the three dimensional resistive memory architecture, according to one example of principles described herein.
Figure 2A:
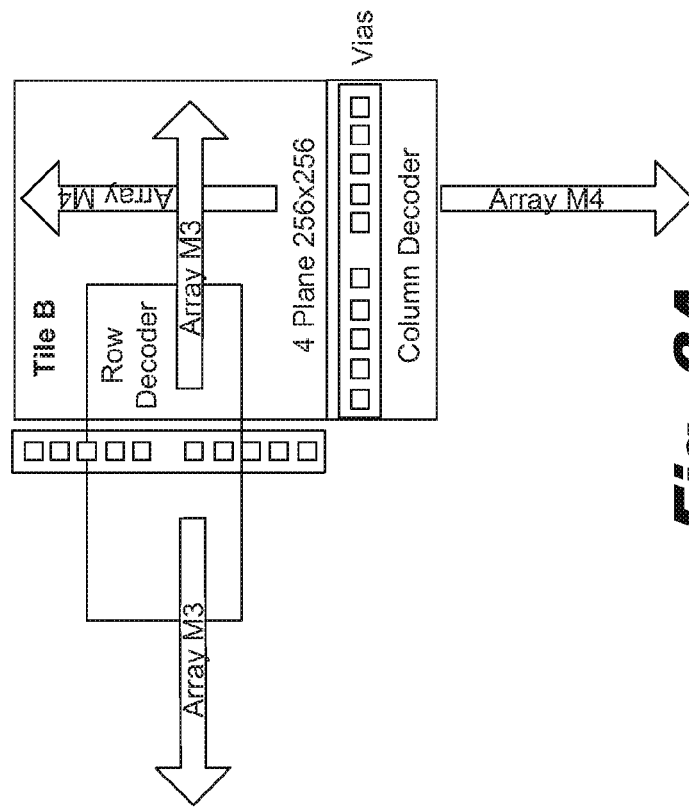

FIGS. 2A and 2B show schematic diagrams describing several examples of tiles. FIG. 2A shows memory tile B, which includes a memory array with four planes, each with 256 column crossbars and 256 row crossbars. The memory array is the square labeled "4 Plane 256×256." As discussed above, memory elements are formed between the column and row crossbars at each intersection. Thus, in this example, there are 256×256 memory elements in each plane for a total of approximately 266 kilobits of memory in the tile. The addressing for the memory array is provided by a row decoder and a column decoder. The decoders accept an address and select the indicated row and column. Memory tile B has five metal layers and extends row crossbars in metal layer M3 into a tile to the left of the memory tile B. This is graphically illustrated by the arrow labeled "Array M3." Consequently, the row decoder can be used to address memory elements that are connected to the extended row lines, even if they are located in an adjacent tile. Memory tile B also extends column lines in metal layer M4 into the tile below. The column decoder can address all memory elements that are connected to the column lines M4. The underlying decoder circuitry is shown as a column decoder and a row decoder with schematic representations of vias that come up from the decoder to attach to the crossbars in the memory arrays. It should be noted that for purposes of illustration, the number and sizes of the various elements may not be to scale and may have different scales than the surrounding elements. For example, in a 4 plane 256×256 memory there may be 256 vias along each side and the vias may have cross sectional dimensions on the order of nanometers or tens of nanometers. However, in the figure only ten vias for each decoder are shown. The scale of the vias has been selected so that the vias are easily viewable.

FIG. 2B shows memory tile A, which is similar to memory tile B except that memory tile A extends row lines in metal layers M1 and M5 into the tile on the left and column lines in metal layer M2 into a tile below. These extended crossbars are shown as arrows labeled "Array M1-M5" and "M2." As shown in the cross sectional diagram of FIG. 1, the M1 and M5 layers are connected by a stack of vias. Row crossbars in layers M1 and M5 can still be used to uniquely address memory elements even though they are joined because the row crossbars in M1 are paired with the column crossbars in M2 and the row crossbars in M5 are paired with the column crossbars in M4.

Figure 3:
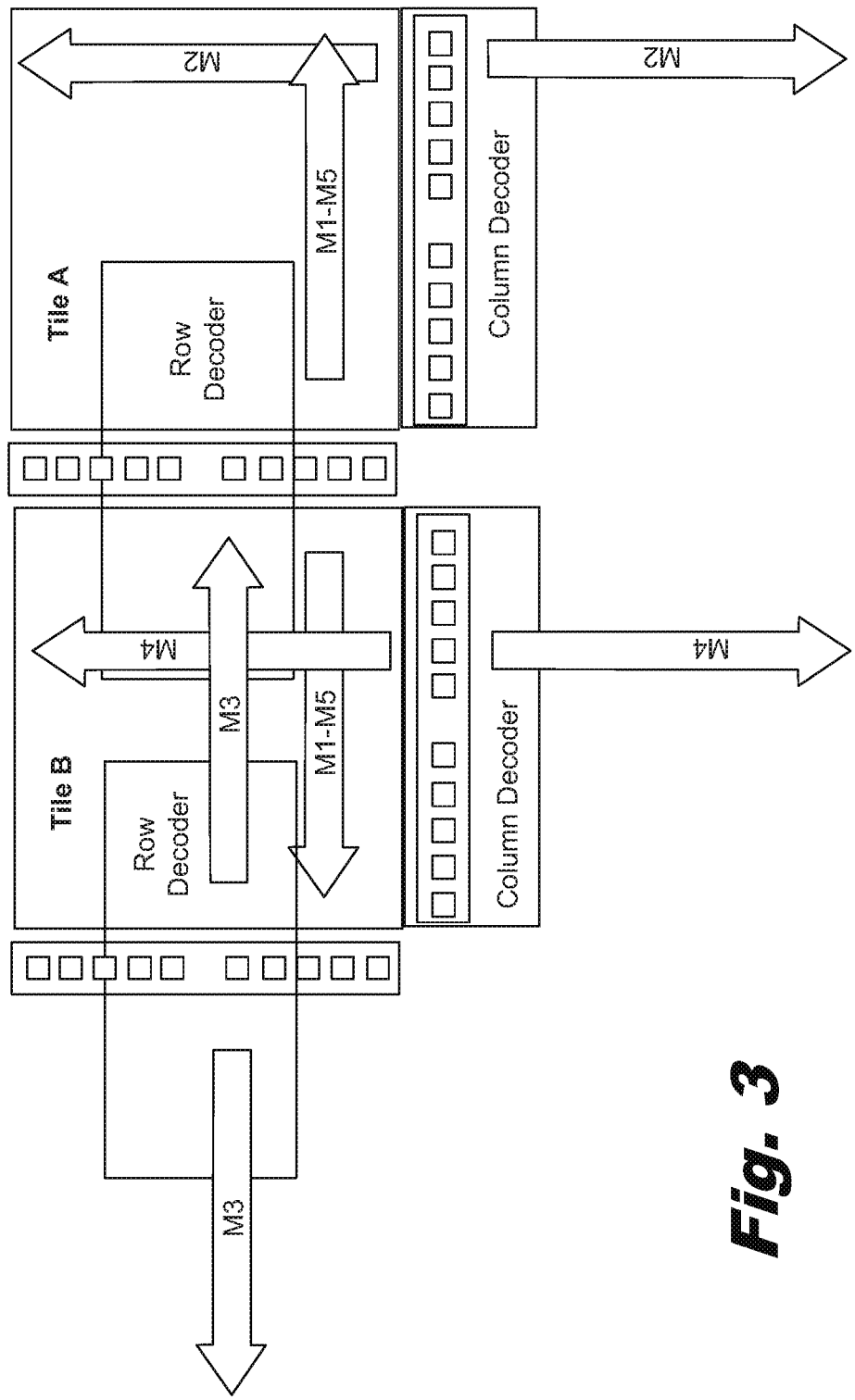
FIG. 3 shows the tiles of FIGS. 2A and 2B joined to form a pair of interconnected tiles, according to one example of principles described herein.

FIG. 3 shows a pair of joined tiles, with tile B on the left and tile A on the right. The row lines in the M1 and M5 layers extend from tile A into tile B. Consequently, the row decoder and row lines M1 and M5 originating in tile A can be used to address memory elements in the D1 and D4 layers in the neighboring tile B. At this point, tile A can only address memory elements in layer D1, which is sandwiched between the M1 row lines and the M2 columns. Tile A addresses these memory elements using its decoders. However, tile B can address memory elements in layers D3 (sandwiched between the M3 rows and M4 columns) using both of its own decoders and D4 (sandwiched between M4 column crossbars and M5 row crossbars) using one of its own decoders and the M3 row decoder originating in tile A.

Figure 4:
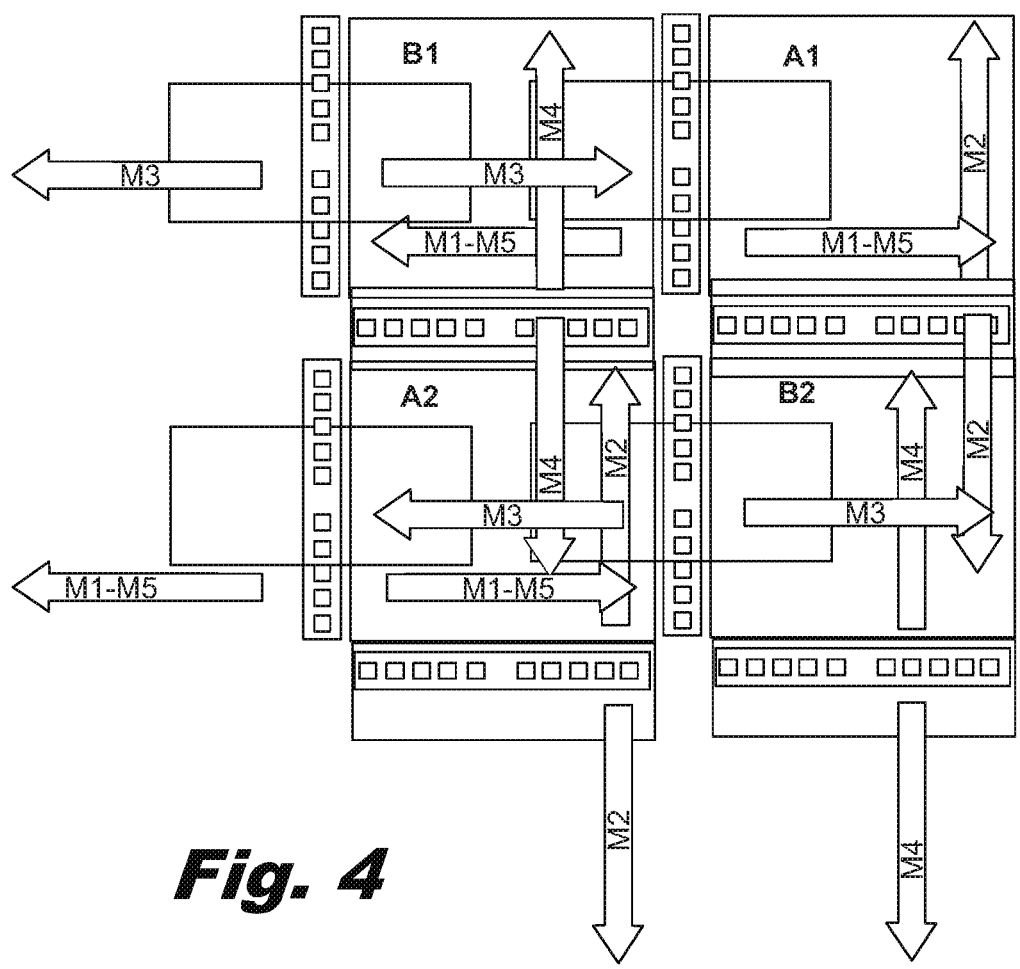
FIG. 4 shows four interconnected tiles in a three dimensional resistive memory architecture, according to one example of principles described herein.

FIG. 4 shows that by tiling two pairs together, a 2×2 matrix of tiles is formed and the extended row and column lines provide additional addressing efficiency. The top two tiles (now labeled "A1" and "B1") are taken from FIG. 3. A pair of tiles (A2, B2) are joined to the bottom of the upper pair to form a unit with a 1 Mbit capacity. The lower pair of tiles (A2, B2) receives the extended column lines from the upper pair (A1, B1). Specifically, tile B2 receives extended M2 columns from tile A1 and tile A2 receives extended M4 columns from tile B1. Tile B2 does not yet have a full complement of addressable crossbars and can only address memory elements in layers D2 (sandwiched between the M2 columns and M3 rows) and D3 (sandwiched between M3 rows and M4 columns).

However, tile A2 includes full addressing and access to all the memory elements in its memory array. Specifically, tile A2 obtains M4 column addressing from tile B1 and M3 row addressing from tile B2. Tile A2 supplies its own M1-M5 row and M2 column addressing.

Figure 5:
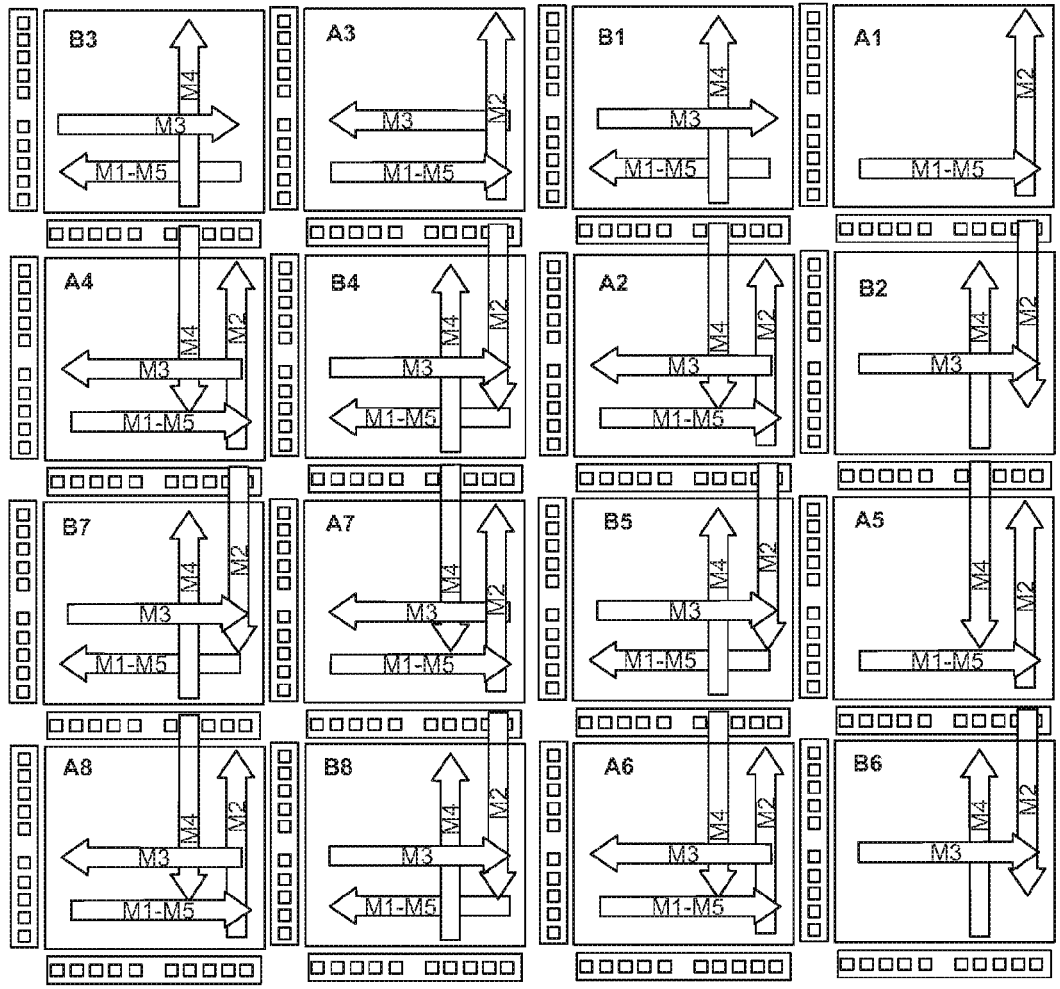
FIG. 5 shows sixteen interconnected tiles in a three dimensional resistive memory architecture, according to one example of principles described herein.

FIG. 5 shows a 4×4 array of joined tiles. This array was created by replicating and joining four of the 2×2 arrays shown in FIG. 4. For purposes of illustration, the tile diagrams have been simplified by not showing the outlines of the row and column decoders and not showing crossbar extensions on perimeter tiles that do not extend into a neighboring tile. In this example, all the tiles except for those on the upper row and right most column ("perimeter tiles") have complete addressing by sharing two addressing decoders with adjacent neighbors on their upper and right sides. Specifically, tiles A2, B4, A4, B5, A7, B7, A6, B8, and A8 are fully addressed. A target resistive memory element in one of these tiles may be addressed by a row decoder in the adjacent tile and a column decoder in a different adjacent tile. For example, in memory tile A7, memory elements in layer D3 are addressed by a decoder and extended column lines M4 originating in tile B4 and a decoder and extended row lines M3 in tile B5.

Figure 6:
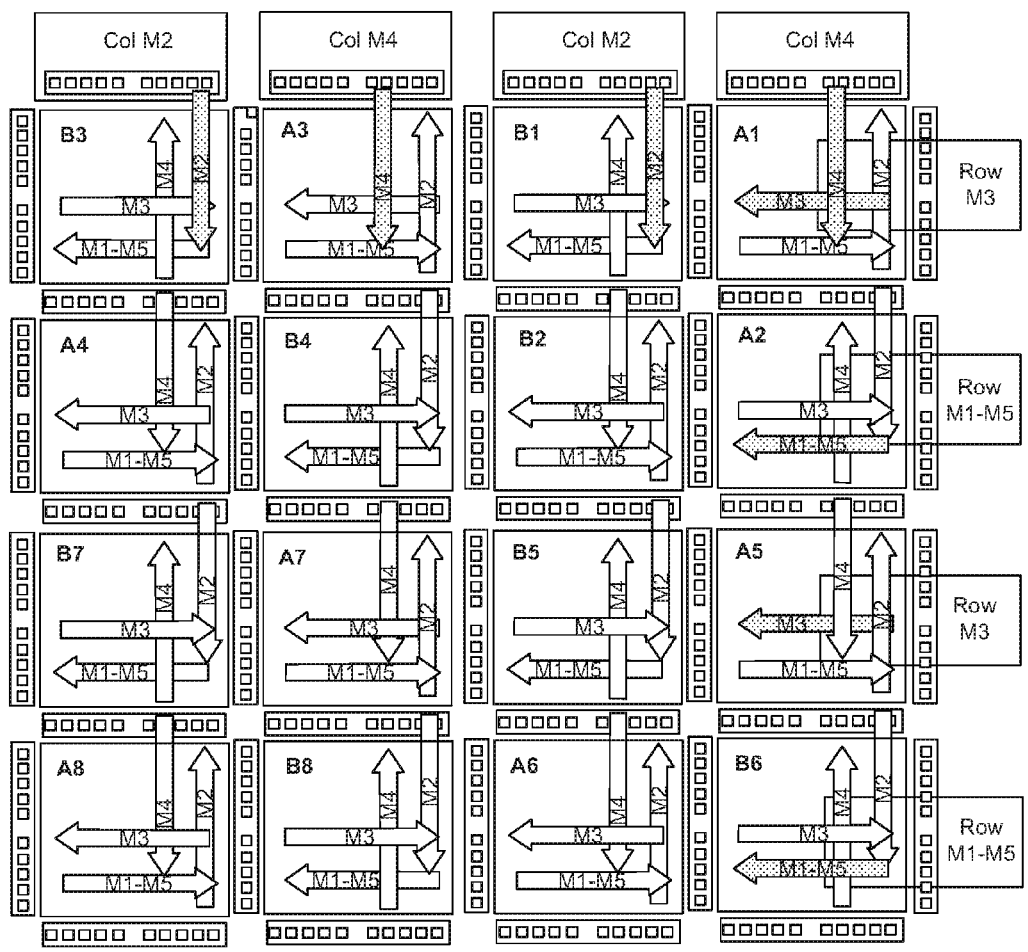
FIG. 6 shows sixteen interconnected tiles with edge decoders to complete the addressing of perimeter tiles, according to one example of principles described herein.

FIG. 6 shows additional decoders added around the upper and right sides of the tile array to complete the addressing of the perimeter tiles. These dedicated decoders only address resistive memory elements in their associated perimeter tile. The labels on the dedicated decoders show the crossbar type and layer that the decoders address. Arrows representing the additionally addressed rows and columns have been shaded and the associated decoders are shown. This completes the addressing of this array with every tile being able to address all of its memory elements.

Although a 4×4 array has been shown, array of tiles may have a variety of shapes and sizes. For example, the array may be a 16×16 array of tiles for a total of 256 tiles with a combined capacity of 64 Mbits. Additionally, the specific details given above were merely examples. The principles described could be used in a variety of designs.

FIGS. 7-11 describe principles related to addressing the various tiles, decoders, and memory elements in memory arrays in the three dimensional resistive memory architecture.

Figure 7:
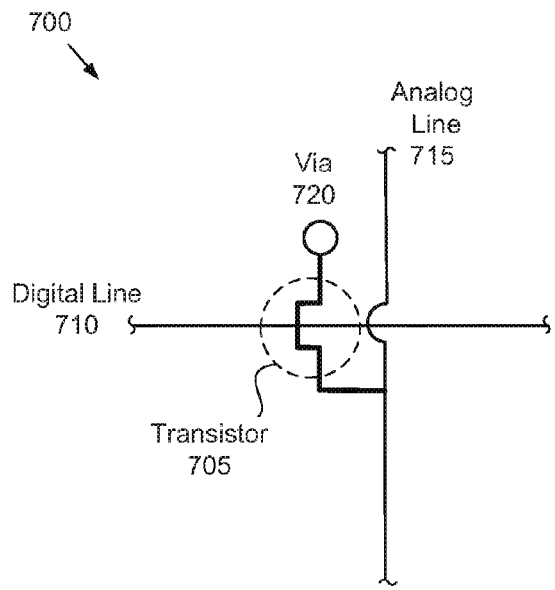
FIG. 7 is a schematic diagram of a final decoder in the three dimensional resistive memory architecture, according to one example of principles described herein.

FIG. 7 is a final decoder circuit (700) that is configured to selectively apply an analog signal to a selected row or column crossbar in an overlying memory array. The final decoder circuit (700) includes a transistor (705), a digital select line (710) connected to the gate of a transistor (705), an analog select line (715) connected to the source terminal of the transistor, and a via (720) that is connected to the drain terminal of the transistor. The via extends upward from the addressing circuitry to connect with a row or column crossbar in the memory array. Application of a digital signal on the digital line (710) to the gate terminal connects the source terminal to the drain terminal. This allows an analog signal on the analog select line to pass through the transistor into the selected row or column.

The digital select line may have either a high voltage (a digital 1) or a low voltage (a digital 0). When the digital select line is high, the transistor is in its conductive state and connects the analog line to the via. When the digital select line is low, the analog select line is disconnected from the via. In either case, the analog select line may or may not be carrying an active signal. The decoder circuit can include a single NMOS transistor. However, decoder circuit could be a PMOS transistor or a NMOS/PMOS pair. Where the final decoder is a NMOS transistor, a relatively high voltage can be applied to the gate so that the NMOS transistor conducts current in both directions. Thus, the designation of a source and a drain for the transistor (715) becomes arbitrary because current passes both directions through the transistor.

The final decoder circuits can be grouped into an address matrix that is made up of crossing analog lines and digital lines. Each analog line crosses each digital line. One final decoder circuit is connected at the crossing point of each analog line and digital line in the address matrix. This results in multiple transistors connected to a single digital line. When a particular digital select line has a high voltage signal, all of the final decoder circuits connected to that digital select line will go into a conductive state and connects all the analog lines to the vias.

Figure 8:
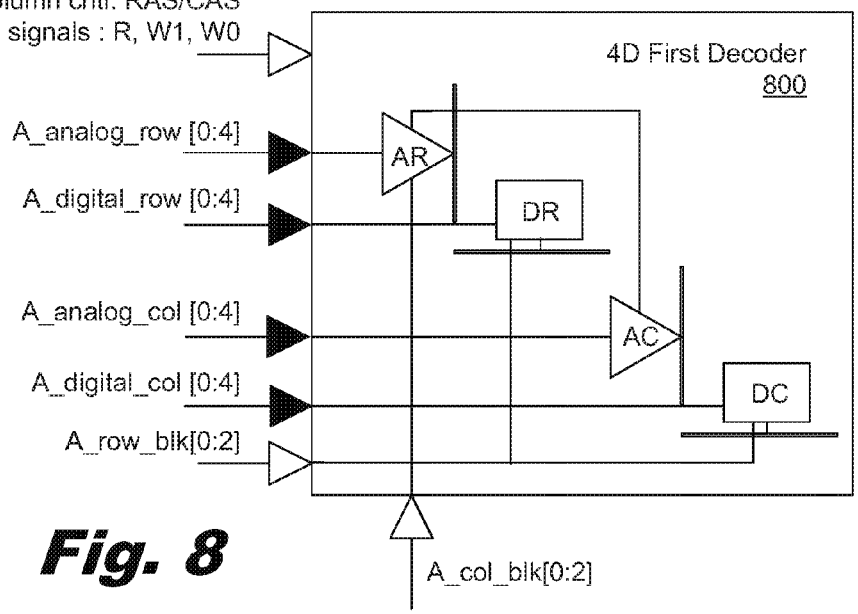
FIG. 8 is a schematic diagram of a decoding scheme for the three dimensional resistive memory architecture, according to one example of principles described herein.

FIG. 8 is a logical representation of how a four dimensional first decoder (800) accepts an address and selects the appropriate digital and analog lines connected to the final decoders. The inputs to the first decoder include a number power and control lines. In this example, input lines include a high voltage input (VDDHV) and a ground (gnd). The high voltage input refers to a voltage that is high enough to cause NMOS transistors to conduct in a bidirectional manner. This voltage may be higher than a typical digital signal. For example, a standard digital signal may have a voltage of 2 volts and the high voltage input may be 4 volts.

A number of analog lines/signals can be input into the first decoder, including: data bus line(s) (DB), a read voltage (VR), a write voltage to write a target memory element to a first state (W1), and a write voltage to write a target memory element to a second state (W0). A number of operation control signals/lines are also input to the first decoder. Row and column control lines include Row Access Strobe (RAS) and Column Access Strobe (CAS) lines/signals. READ/WRITE control signals R, W1 and W0 communicate which mode the memory array tile is to operate in: read (R), write to a low ON resistance (W1), or write to a high OFF resistance (W0). These operation control signals select a voltage level and polarity of the analog signal to produce the desired operation on the memory elements.

An address is also input into the first decoder. The first decoder is selected from other first decoders in a storage device using decoder selection bits in the address (A_row_blk[0:2]; A_col_blk[0:2]). The remainder of the address includes a digital component (A_digital_row[4:0], A_digital_col[4:0]) and an analog component (A_analog_row[4:0], A_analog_col[4:0]).

The digital row component (A_digital_row[4:0]) of the address is used to select a set of row crossbars. This operation is shown as square labeled "DR" in the diagram that accepts the digital row address. The analog row component (A_analog_row[4:0]) is used to select one of the row crossbars from the row crossbar set. This operation is shown as a triangle labeled "AR" in the diagram that accepts the digital column address.

The digital column component (A_digital_col [4:0]) is used to select a set of column crossbars. This operation is shown as a square labeled "DC" in the diagram that accepts the digital column address. The analog column component (A_analog_col[4:0]) is used to select one of the column crossbars from the column crossbar set. This operation is shown as a triangle labeled "AC" in the diagram that accepts the digital column address.

Figure 9:
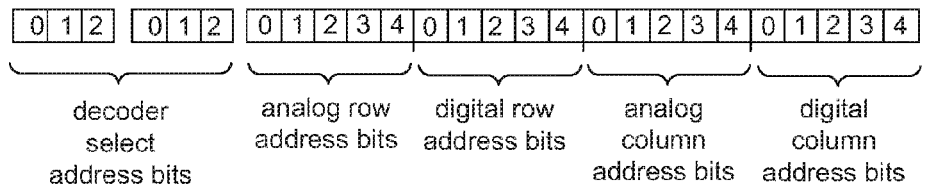
FIG. 9 is a diagram of an address for a three dimensional resistive memory architecture, according to one example of principles described herein.

FIG. 9 shows one example of a 26 bit address that could be used to address memory elements in a three dimensional resistive memory architecture. The four dimensional address comprises a decoder select address (6 bits), a digital row address (5 bits), an analog row address (5 bits), a digital column address (5 bits) and an analog column address (5 bits). The decoder select address (the first 6 bits) is used to select the decoders that address the target memory element. The decoders that are selected may operate while the rest of the decoders are inactive. As discussed below, the next 20 bits are used to select analog lines and digital lines in an address matrix.

Figure 10:
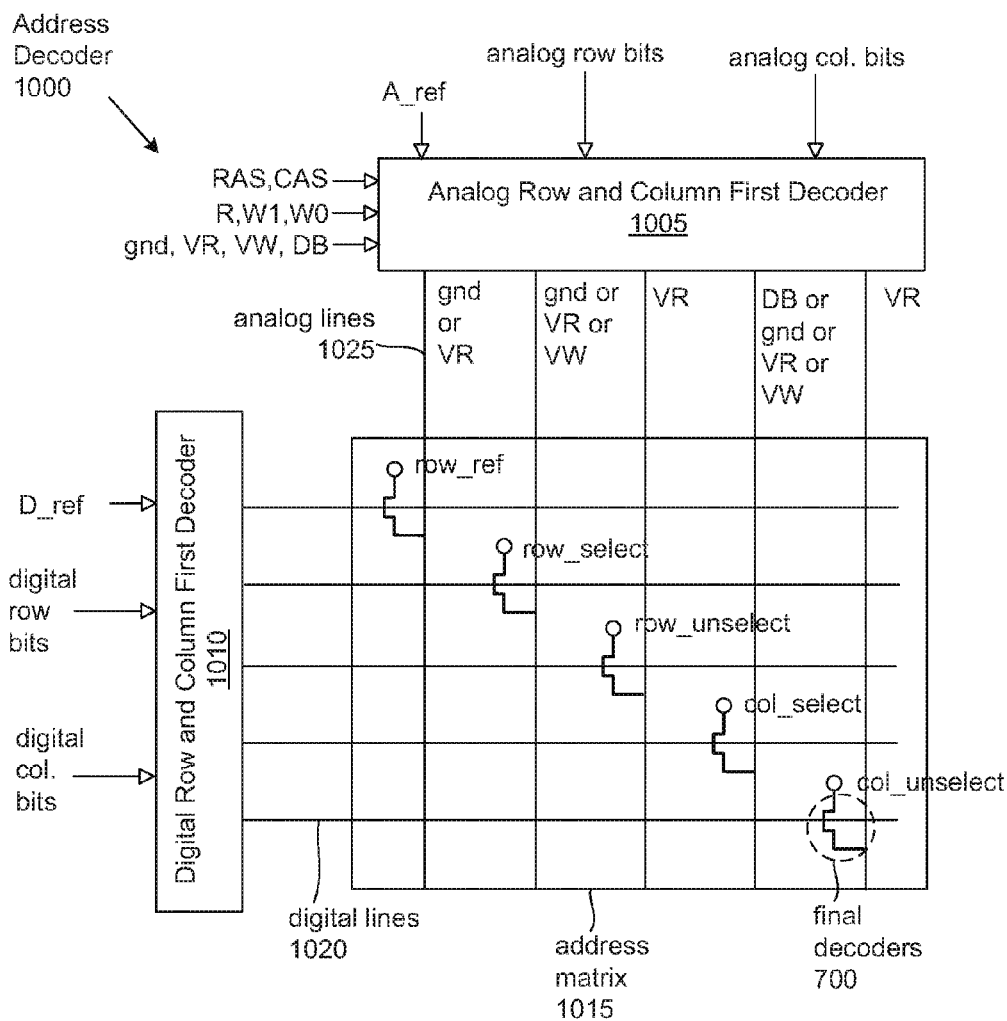
FIG. 10 is a schematic diagram showing addressing and decoding within the three dimensional resistive memory architecture, according to one example of principles described herein.

FIG. 10 is a diagram that shows a four dimensional combined address decoder (1000) that includes both the first decoder (FIG. 8), final decoders (FIG. 7), and accepts the four dimensional address (FIG. 9). In this example, the first decoder has been split into two separate units, an analog row and column first decoder (1005) and a digital row and column first decoder (1010).

The address matrix (1015) includes a number of horizontal lines (1020) that are connected to the digital decoder. These lines are called "digital lines" and can be either "digital row lines" or "digital column lines" based on whether they are used to address row crossbars or column crossbars. Vertical lines (1025) are connected to the analog decoder. These lines are called "analog lines" and can be either "analog row lines" or "analog column lines" based on whether they are used to address row crossbars or column crossbars. The analog lines cross each of the digital lines. For this illustration, the number of lines has been reduced by showing groups of unselected lines as a single line.

Final decoders (700) are connected at the crossing points to the digital lines and the analog lines. The analog decoder (1005) is configured to accept the analog row and column addresses and to select which voltage/connection is applied to each of the analog lines. For example, the selected analog row line may be connected to ground, a write voltage or a read voltage. A bias voltage is applied to "half selected analog lines." The "half selected analog lines" have been selected digitally because they are connected to transistors that have a voltage applied at their gate by the selected digital line. In one example, a bias voltage is applied to the half selected analog lines that is equal to the read voltage which is equal to one half of the write voltage (Vb=Vr=Vw/2).

The same conventions are used for the column addressing, except that the selected column line can be connected to a data bus (DB) during read operations. This allows the voltage or current flowing through the target memory device to be read. The selected column line can also be connected to ground ("gnd"), have a read voltage applied (VR) or have a write voltage applied (VW). The half selected column lines have a bias voltage VR applied.

There are 480 vias/crossbars in this portion of the memory array that are not selected and are not connected to analog outputs from the decoders (512 total crossbars–30 half selected crossbars–2 selected crossbars). These vias/crossbars are isolated from the decoders and analog voltages by the very high resistances of the OFF final transistors. These 480 crossbars float to whatever voltage accumulates on the lines. As shown in FIG. 1, all of the crossbars are interconnected by a matrix of resistive memory elements. Consequently, the voltage on the 480 floating crossbars will tend to stabilize at the bias voltage (Vb=VR) due to its application to the 30 half-selected lines.

The address matrix and decoders can be physically split into 2 halves to facilitate the physical layout of a linear group of array contacts to be located on one edge of the memory plane. In the example shown in FIGS. 1-6 and 10 the address matrix and decoders have been split into row decoder/address matrix and column decoder/address matrix. For example, the diagrams in FIGS. 2A and 2B show the row decoders/address matrix as a box labeled "row decoder" and the column decoders/address matrix as a box labeled "column decoder". A 'fifth' final decoder (labeled "row ref") is shown in the final decoder block to access an optional reference row.

Figure 11A:
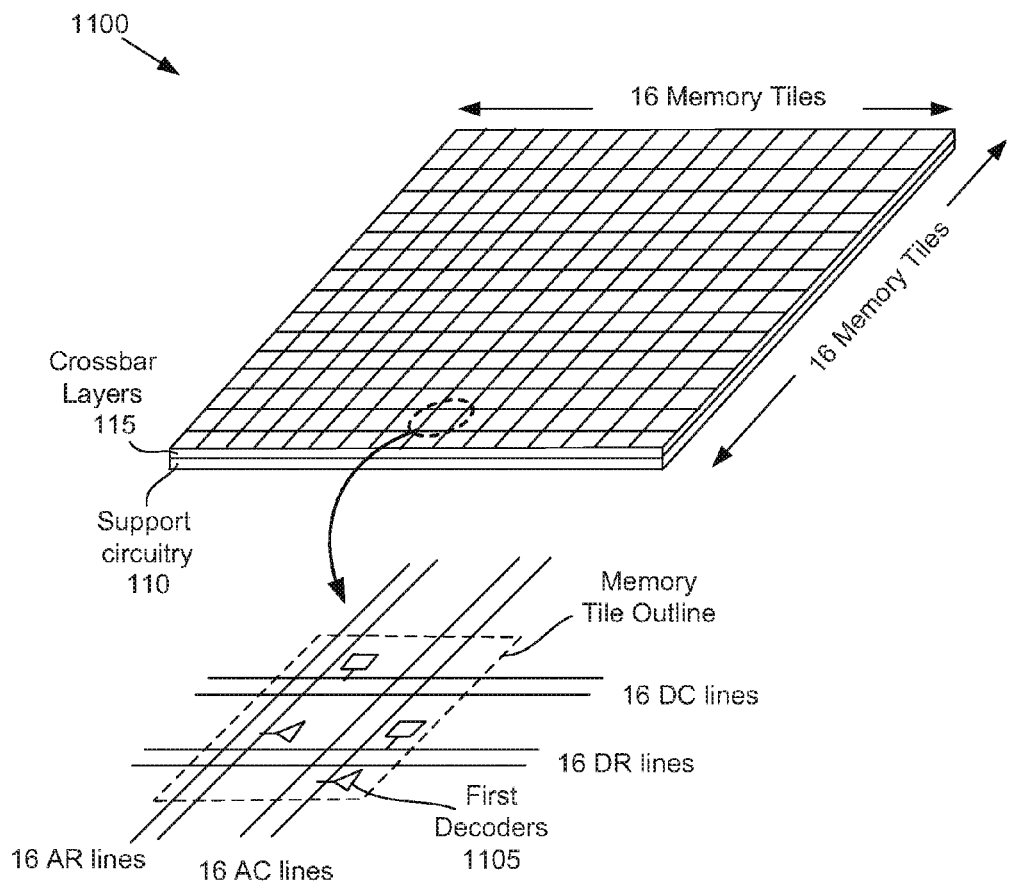
FIGS. 11A and 11B are diagrams illustrating a selection of a resistive memory element within a three dimensional resistive memory architecture based on a four dimensional address, according to one example of principles described herein.

FIG. 11A is a perspective view of one example of a three dimensional resistive memory architecture (1100) that includes an array of sixteen by sixteen memory tiles, for a total of 256 memory tiles. Each memory tile has four planes with 256×256 memory elements in each layer, resulting in a memory architecture that has a capacity of 64 Mbits.

As discussed above, the architecture includes support circuitry (110) and overlying crossbar layers (115). The support circuitry (110) may include address, control, signal and power lines. Additionally, the support circuitry (110) includes the first and second decoders. The lower portion of FIG. 11A shows an enlarged view of a portion of the support circuitry (110) under one memory tile. This view shows the outline of the overlying memory tile as a dashed box. There are four sets of lines shown: sixteen digital column lines ("16 DC lines"), sixteen digital row lines ("16 DR lines"), sixteen analog column lines ("16 AC lines"), and sixteen analog column lines ("16 DC lines").

The first decoders (1105) are connected to the lines. The analog first decoders are represented as triangles and the digital first decoders are represented as squares. This corresponds to the diagram in FIG. 8. The support circuitry under each tile has 1 set of first decoders. The first decoders provide 1 of 16 shared analog or digital signals that are distributed to all the memory tiles in the architecture. This distribution of first decoders provides for efficient layout and delivery of the signals throughout the architecture.

Figure 11B:
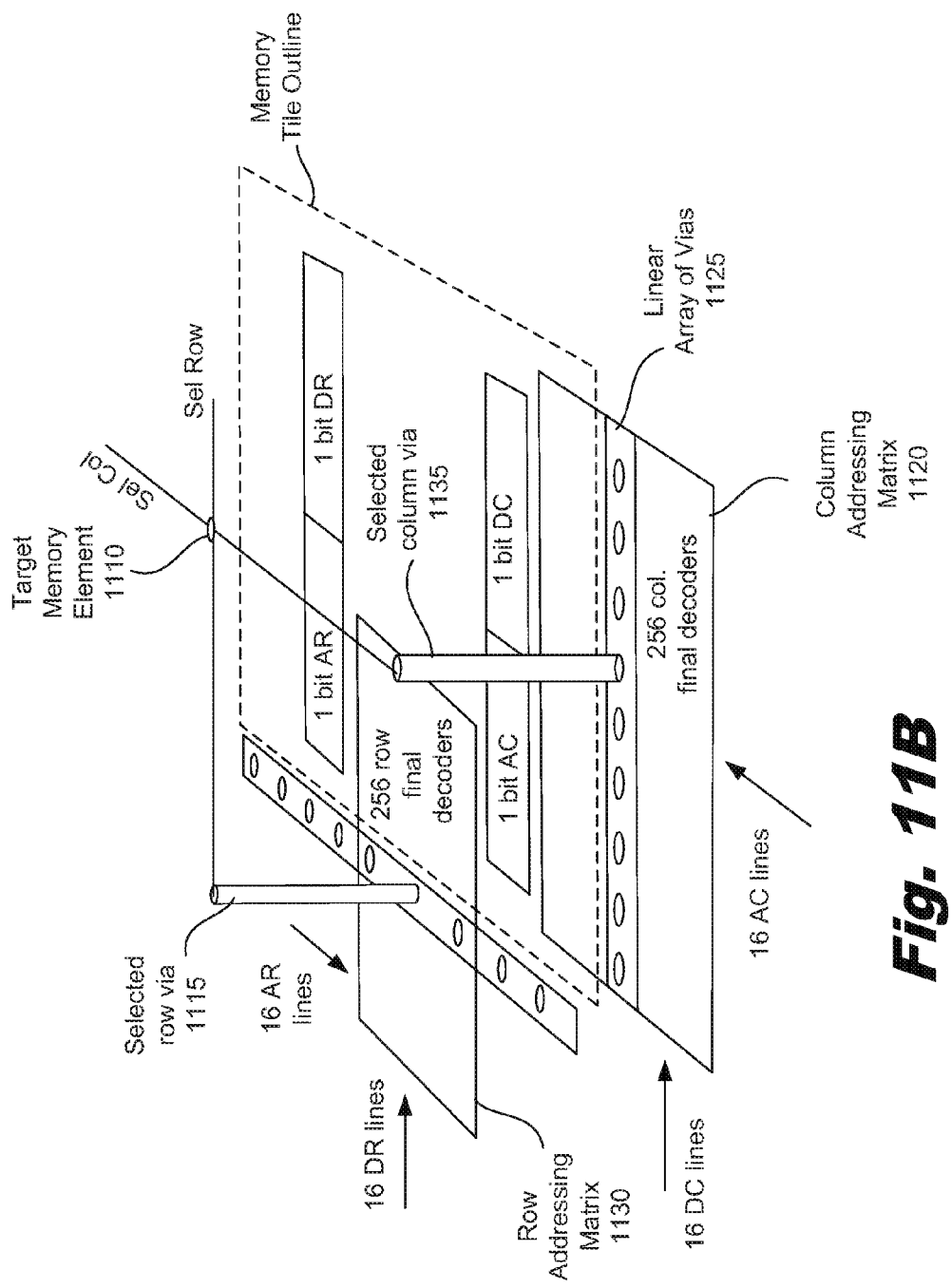

FIG. 11B shows a more physical representation of the decoders, vias, and crossbars under a memory tile. The outline of the memory tile is again shown as a dashed box. As discussed above, the support circuitry under each tile has 1 set of first decoders that provide 1 of 16 shared analog or digital signals that are distributed to all the memory tiles in the architecture. The first decoders include a one bit analog row decoder ("1 bit AR"), a one bit digital row decoder ("1 bit DR") that make up the row first decoder. The other first decoder is the column first decoder that includes an analog column decoder ("1 bit AC") and a one bit digital column decoder ("1 bit DC").

Also shown are the column and row addressing matrices (1120, 1130). Each of these matrices is formed at the intersections of the sixteen digital and analog lines and includes 256 final decoders at the 256 intersections. As discussed above, the final decoders control analog signals that are routed to linear arrays (1125) of upwardly extending vias. These linear arrays of vias are at the periphery of the memory tile and pass upward to connect to crossbars in the memory tile. The selected row via (1115) and column via (1135) are connected to the selected column crossbar ("Sel Col") and selected row crossbar ("Sel Row"). The target memory element (1110) is located at the intersection of the selected row crossbar and the selected column crossbar. For purposes of illustration, only the selected vias, crossbars and target memory element are shown in FIG. 11B.

As shown in FIG. 11B, most of the physical area under the resistive crossbar memory array may be taken by the final decoders. However, there are only a small number of first decoders and it was found that these could also fit under the memory array. In the physical layout above all the first decoders and final decoders of the four dimensional decoding scheme plus the sense amplifiers fit under an 16×16 tiled array with a corresponding memory layout area of 1.2 $F^2$ per bit where F is the memory array feature size.

Figure 12:
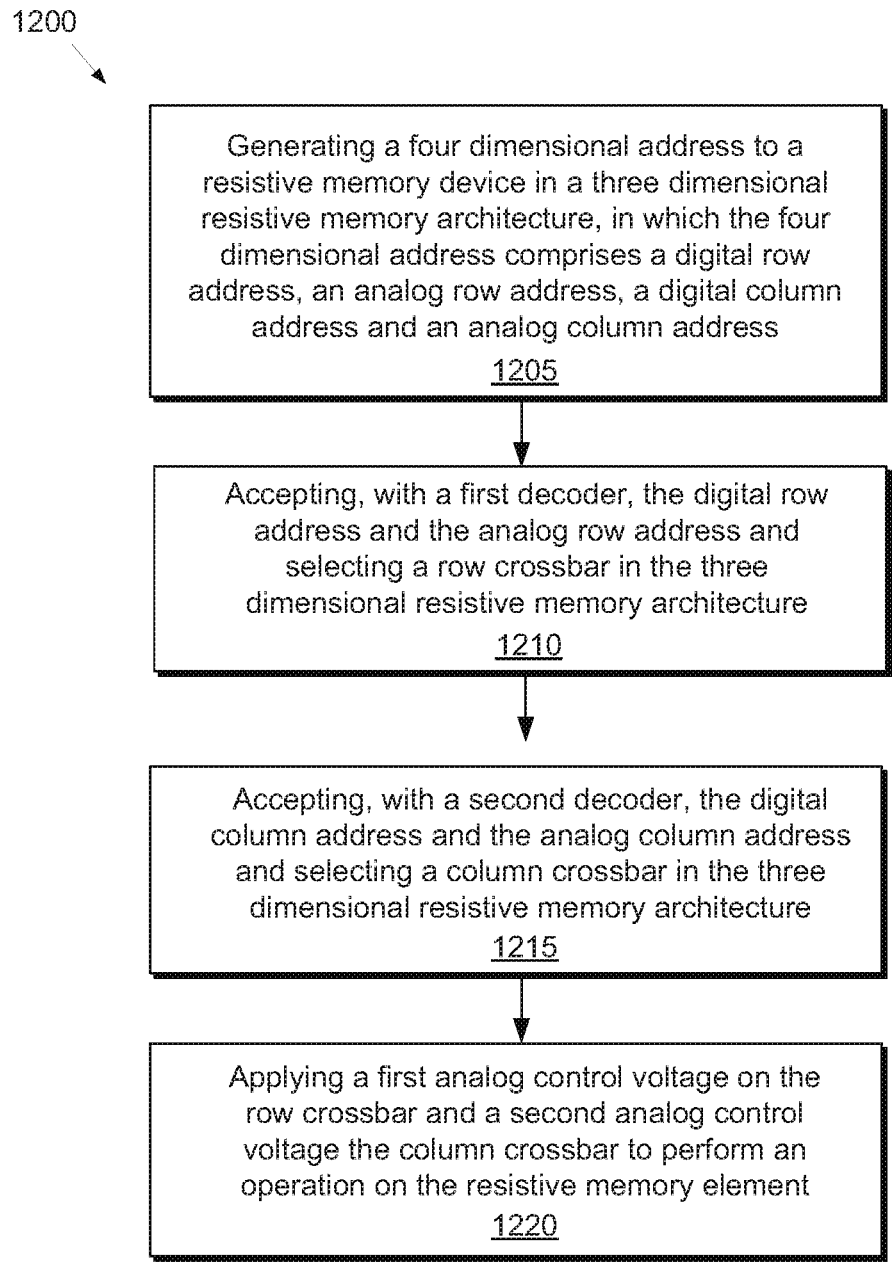
FIG. 12 is a flow chart of a method for selecting a resistive memory element within a three dimensional resistive memory architecture, according to one example of principles described herein.

FIG. 12 is a flowchart of a method (1200) for selecting a resistive memory element within a three dimensional resistive memory architecture based on a four dimensional address. The method includes generating a four dimensional address to a resistive memory element in a three dimensional resistive memory architecture, in which the four dimensional address comprises a digital row address, an analog row address, a digital column address and an analog column address (block 1205). The four dimensional address may be generated in any of a number of ways. In one example, the four dimensional address is generated by a computing device connected to a data storage device that contains the three dimensional resistive memory architecture. In other implementations, the data storage device may accept higher level addressing instructions and translate these instructions into the four dimensional address.

The method further includes accepting, with a first decoder, the digital row address and the analog row address and selecting a row crossbar in the three dimensional resistive memory architecture (block 1210). The selection of the row crossbar is based on the digital row address and analog row address. In one example, selecting a row crossbar comprises applying a voltage to a digital line designated by the digital row address to bring transistors connected to the digital line into a conductive state such that a set of analog lines connected to the transistors are electrically connected to vias extending upward into a resistive memory array. An analog line out of the set of analog lines is selected as designated by the analog row address, in which analog lines in the set of analog lines that were not designated by the analog row address are half selected analog lines. A first analog voltage is applied to the selected analog line. The analog voltage is conducted through the analog line, an activated transistor, and up a via to the selected row crossbar. As discussed above, the analog voltage may be a ground, a connection to a data bus, a read voltage, or write voltage. A bias voltage is applied to the half selected analog lines, such that the bias voltage is conducted through the transistors and vias to row crossbars in the three dimensional resistive memory architecture Additionally, the method includes accepting, with a second decoder, the digital column address and the analog column address and selecting a column crossbar in the three dimensional resistive memory architecture (block 1215). The column crossbar in a manner that is similar to the method described above for the selection of the row crossbar. Specifically, the selection of the column crossbar is based on the digital column address and analog column address. In one example, selecting a column crossbar comprises applying a voltage to a digital line designated by the digital column address to bring transistors connected to the digital line into a conductive state such that a set of analog lines connected to the transistors are electrically connected to vias extending upward into a resistive memory array. An analog line out of the set of analog lines is selected as designated by the analog column address, in which analog lines in the set of analog lines that were not designated by the analog column address are half selected analog lines. A second analog voltage is applied to the selected analog line and to the selected column crossbar. A bias voltage is applied to the half selected analog lines, such that the bias voltage is conducted through the transistors and vias to column crossbars in the three dimensional resistive memory architecture. The method further includes applying a first analog voltage on the row crossbar and a second analog voltage on the column crossbar to perform an operation on the resistive memory element (block 1220). For example, in a read operation one of the first or second analog voltages may be a read voltage and the other analog voltage may be a ground voltage.

Figure 13:
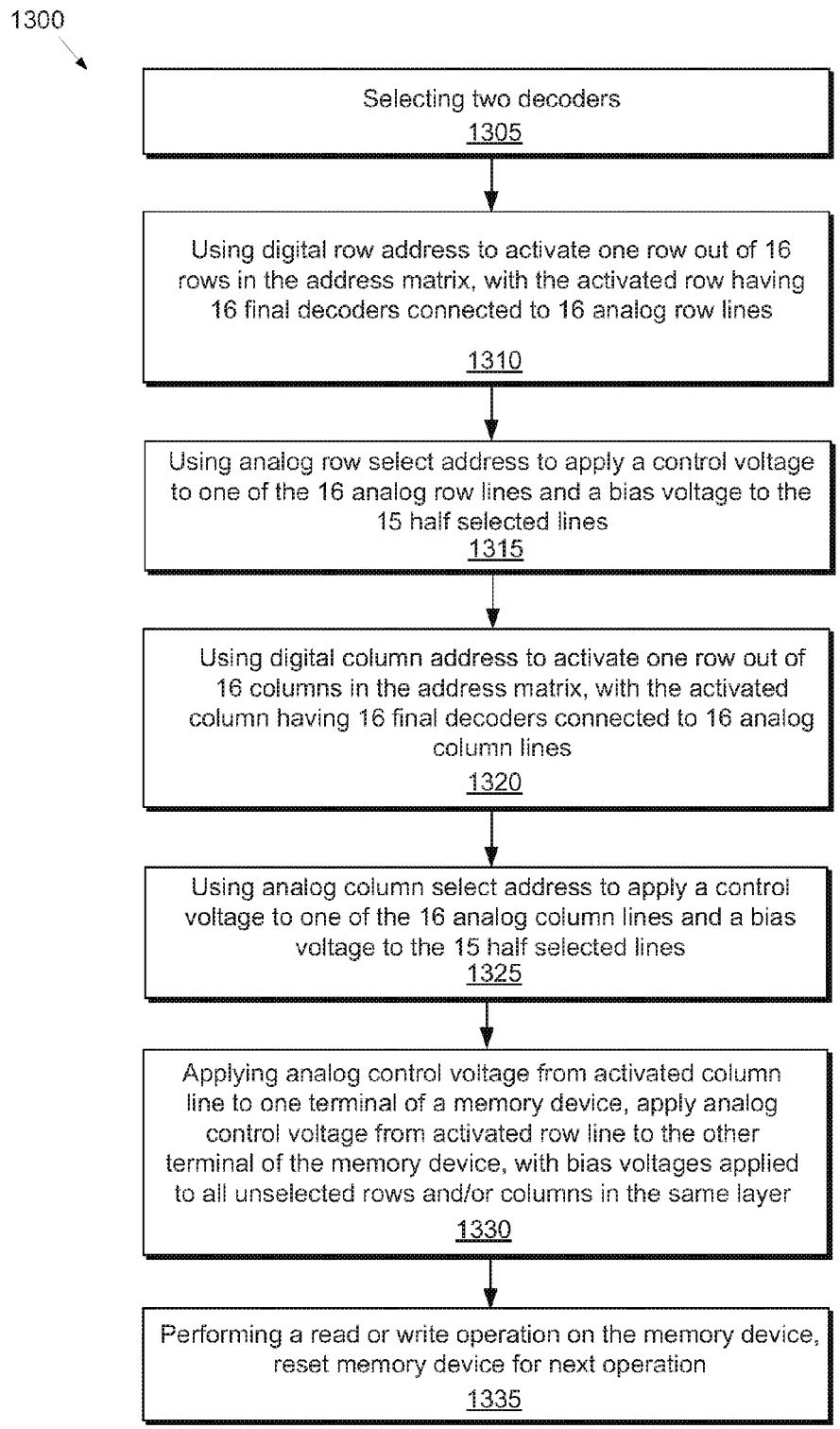
FIG. 13 is a flow chart of a method for selecting a resistive memory element within a three dimensional resistive memory architecture based on a four dimensional address, according to one example of principles described herein.

FIG. 13 is a specific example of a method for selecting a memory element in a three dimensional memory architecture that is addressed with a 26 bit four dimensional address. The memory is formed from memory tiles that have four layer 256×256 resistive memory arrays. For each memory tile, the decoder circuitry has been split into two units: a column decoder to select a column in the overlying memory array and a row decoder to select a row in the overlying memory array (see e.g. FIG. 11). As discussed above, the address includes two decoder select addresses (3 bits each), an analog row address (5 bits), digital row address (5 bits), analog column address (5 bits) and a digital column address (5 bits).

The method includes using the decoder select bits to select a row decoder and a column decoder pair that can be used to address the target memory element (block 1305). The digital row address is used to activate one row out of 16 rows in the address matrix, with the activated row having 16 final decoders connected to 16 analog row lines (block 1310). The analog row address is used to apply an analog voltage to one of the 16 analog row lines and a bias voltage to the 15 half selected lines (block 1315).

A similar process is used to select the column crossbar. The digital column address is used to activate one row out of 16 columns in the address matrix, with the activated column having 16 final decoders connected to 16 analog column lines (block 1320). The analog column address is used to apply an analog voltage to one of the 16 analog column lines and a bias voltage to the 15 half selected lines (block 1325).

An analog voltage is applied from the activated column line, up the via, and into the attached column crossbar. The column crossbar is connected to one terminal of a target memory element. A second and different analog voltage may be applied to the other terminal of the target memory element and a bias voltage is applied to half selected rows and/or columns (block 1330). In read operations one of the analog voltages may be replaced with a connection to a data bus. The desired read or write operation on the memory device is then performed and the system is reset for the next operation (block 1335). As discussed above, the use of a bias voltage can allow for significantly faster operation of the device and minimize reset times.

The principles above describe a high density, area efficient, resistive memory, four plane, cross point array featuring four dimensional address decoding to create a set of analog and digital control signals to drive an area efficient final decoder. The final decoders are split to efficiently connect to crossbars in the array. This architecture provides for tiling of multiple memory blocks, minimizing array wiring resistances and reducing the physical area required to connect to submicron array lines.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A three dimensional resistive memory architecture comprising:
   adjacent memory tiles, each tile comprising:
      a multilevel resistive crossbar array comprising layers of row crossbars, layers of column crossbars, and layers of resistive memory elements interposed between cross points of the row crossbars and the column crossbars, in which at least one layer of crossbars extends from a first tile through an adjacent tile and is used to address resistive memory elements in the adjacent tile;

an address matrix comprising digital lines and analog lines, the digital lines crossing the analog lines;

at least one first decoder, the first decoder being to select an analog line from the address matrix and a digital line from the address matrix based on a digital address; and final decoders including a row decoder and a column decoder, the row decoder being to select a row crossbar, the column decoder being to select a column crossbar, the row decoder being shared by the first tile and the adjacent tile and the column decoder being shared by the first tile and a different adjacent tile.

2. The architecture of claim 1, in which a layer of row crossbars extends through the adjacent neighboring tile and layer of column crossbars extends through the different adjacent neighboring tile.

3. The architecture of claim 1, in which the multilayer resistive crossbar array comprises four layers of resistive memory elements with three layers of the resistive memory elements at least partially addressed by decoders in adjacent tiles.

4. The architecture of claim 3, further comprising a dedicated decoder along an exposed edge of a perimeter tile in an array of the adjacent tiles, in which the dedicated decoders only address resistive memory elements in the perimeter tile.

5. The architecture of claim 1, in which the digital lines in the address matrix cross the analog lines in the address matrix, in which the digital lines supply switching signals and the analog lines supply signals to be applied to crossbars in the multilevel resistive crossbar array.

6. The architecture of claim 1, wherein the final decoders comprise a transistor with a gate connected to one of the digital lines, a source connected to an analog line, and a via connected to a drain, the via extending upward and connected to a crossbar in the multilevel resistive crossbar array.

7. The architecture of claim 6, in which the final decoder is a NMOS transistor that makes a bidirectional connection between the via and the analog line when activated by an applied voltage on a selected digital line.

8. The architecture of claim 1, wherein the digital address comprises decoder selection bits, digital row bits, digital column bits, analog row bits and analog column bits.

9. The architecture of claim 8, in which each of the row decoder and the column decoder comprise a decoder selector that accepts the decoder selection bits to selectively activate the row decoder and the column decoder, wherein an addressed resistive memory element in a tile is addressed by a row decoder in the adjacent tile and a column decoder in a different adjacent tile.

10. The architecture of claim 1, wherein the digital address is a four dimensional address comprising a digital component and an analog component, in which the at least one decoder is to accept the four dimensional address and use the digital component to select which analog lines to connect to crossbars and use the analog component to select voltages to be applied to the analog lines connected to the crossbars.

11. A three dimensional resistive memory architecture comprising:

adjacent tiles, each tile comprising:
a multilevel resistive crossbar array comprising layers of row crossbars, layers of column crossbars, and four layers of resistive memory elements interposed between cross points of the row crossbars and column crossbars;
in which three layers of the resistive memory elements are at least partially addressed by decoders in adjacent tiles;
in which a layer of row crossbars extends from a first tile through an adjacent tile and is used to address resistive memory elements in the adjacent tile and a layer of row crossbars extends from the first tile through a different adjacent tile and is used to address resistive memory elements in the different adjacent tile; and two decoders underlying the multilevel resistive crossbar array, each decoder comprising an address matrix comprising an array of first decoders, an array of final decoders, digital lines and analog lines;
the first decoder being to select an analog line from the address matrix and a digital line from the address matrix based on an address;
the final decoders including a row decoder and a column decoder, the row decoder being to select a row crossbar, the column decoder being to select a column crossbar, the row decoder being shared by the first tile and the adjacent tile and the column decoder being shared by the first tile and a different adjacent tile;
in which each of the final decoders comprise an NMOS transistor with a gate connected to one of the digital lines, a source connected to an analog line, and a via connected to a drain, the via extending upward and connected to a crossbar in the multilevel resistive crossbar array;
in which the digital lines are to select which analog lines to connect to the row crossbars and the column crossbars by applying a switching voltage to the gates of the NMOS transistors to make bidirectional connections between the vias and the analog lines, in which the analog lines are to supply signals to crossbars in the multilevel resistive crossbar array.

* * * * *